United States Patent
Desai et al.

(10) Patent No.: US 7,078,710 B2
(45) Date of Patent: Jul. 18, 2006

(54) ION BEAM SYSTEM

(75) Inventors: Tushar Desai, South Burlington, VT (US); Ellis C. Hayford, Williston, VT (US); Nicholas Mone, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 10/710,051

(22) Filed: Jun. 15, 2004

(65) Prior Publication Data

US 2005/0274910 A1    Dec. 15, 2005

(51) Int. Cl.
*H01J 37/36* (2006.01)

(52) U.S. Cl. .............................. 250/492.21; 250/492.2

(58) Field of Classification Search ........... 250/492.21, 250/492.2, 309
See application file for complete search history.

(56) References Cited

U.S. PATENT DOCUMENTS 5,633,506 A * 5/1997 Blake .................... 250/492.21
5,670,217 A * 9/1997 Blake et al. ................ 427/476

* cited by examiner

*Primary Examiner*—Kiet T. Nguyen
(74) *Attorney, Agent, or Firm*—Schmeiser, Olsen & Watts; William D. Sabo

(57) ABSTRACT

A method of reducing foreign material contamination of a substrate in an ion beam system and an ion beam system. The system, including: a vacuum chamber having an ion beam axis; a substrate chamber free to tilt about a tilt axis, the tilt axis orthogonal to and intersecting the ion beam axis; a flexible bellows connecting an opening in the substrate chamber and an opening in the vacuum chamber, both openings co-axially aligned with the ion beam axis, the bellows providing a vacuum seal between the substrate chamber and the vacuum chamber; and a hollow foreign material shield open at a top proximate to the vacuum chamber and a bottom proximate to the substrate chamber, the foreign material shield located between the ion beam axis and the flexible bellows, the top and bottom of the foreign material shield co-axially aligned with the ion beam axis.

30 Claims, 10 Drawing Sheets

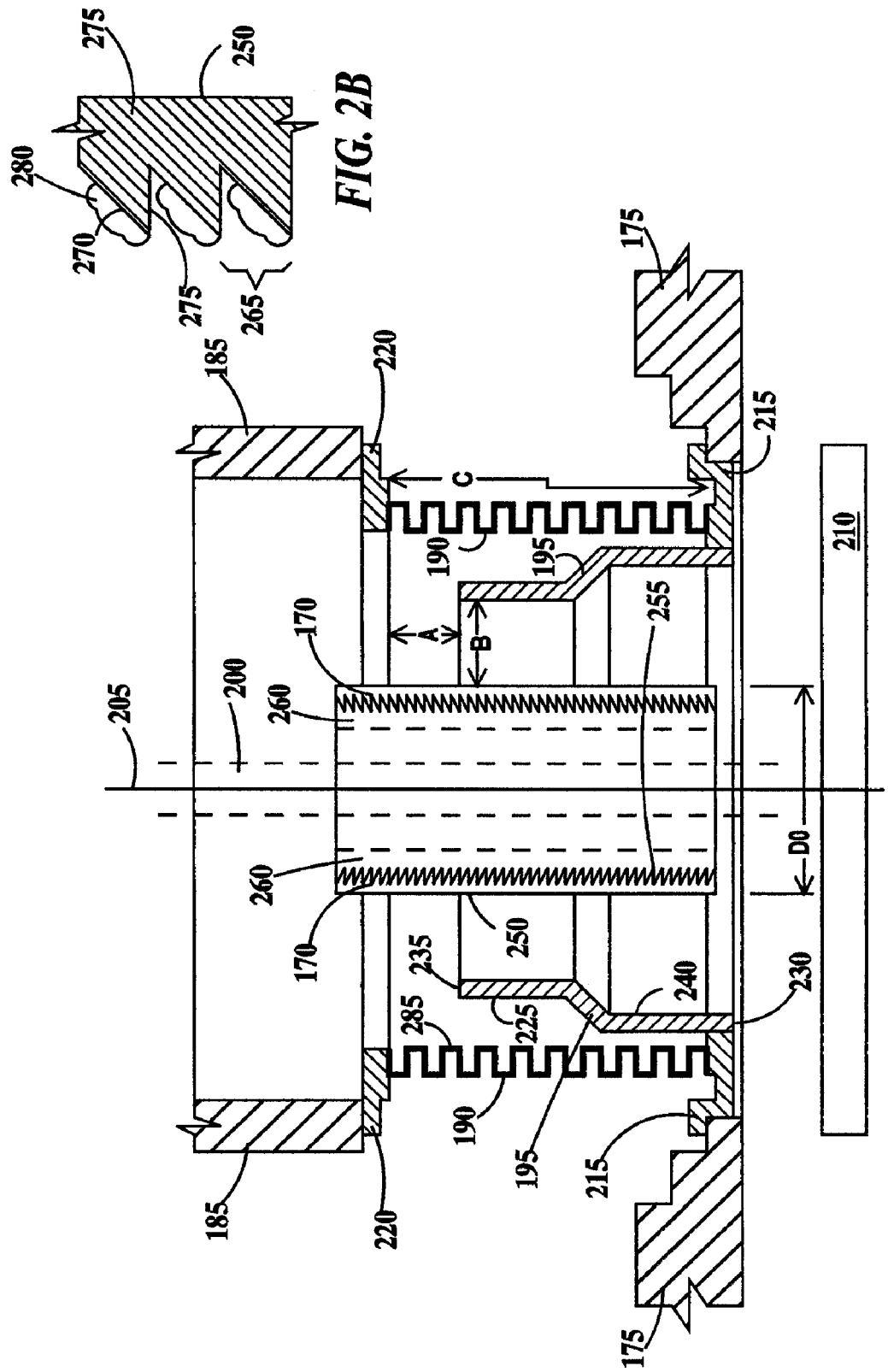

ION BEAM SYSTEM

BACKGROUND OF INVENTION

1. Field of the Invention

The present invention relates to the field of ion beam tooling; more specifically, it relates to an apparatus for bombarding or implanting ions in a substrate.

2. Background of the Invention

Fabrication of modern semiconductors utilize ion beam bombardment of charged species into a substrate to introduce impurities into the substrate in a very precise and controllable way. However, ion beam bombardment tools can generate foreign materials as particles or films that can contaminate the substrate being fabricated as well the ion bombardment. This can lead to poor quality product or yield loss or both. Therefore, there is a need for reducing foreign material contamination of substrates in ion beam systems.

SUMMARY OF INVENTION

A first aspect of the present invention is an ion beam system, comprising: a vacuum chamber having an ion beam axis; a substrate chamber free to tilt about a tilt axis, the tilt axis orthogonal to and intersecting the ion beam axis; a flexible bellows connecting an opening in the substrate chamber co-axially aligned with the ion beam axis and an opening in the vacuum chamber co-axially aligned with the ion beam axis, the bellows providing a vacuum seal between the substrate chamber and the vacuum chamber; and a hollow foreign material shield open at a top proximate to the vacuum chamber and a bottom proximate to the substrate chamber, the foreign material shield located between the ion beam axis and the flexible bellows, the top and bottom of the foreign material shield co-axially aligned with the ion beam axis.

A second aspect of the present invention is a method of reducing foreign material contamination of a substrate in an ion beam system, comprising: providing a vacuum chamber having an ion beam axis; providing a substrate chamber free to tilt about a tilt axis, the tilt axis orthogonal to and intersecting the ion beam axis; providing a flexible bellows connecting an opening in the substrate chamber co-axially aligned with the ion beam axis and an opening in the vacuum chamber co-axially aligned with the ion beam axis, the bellows providing a vacuum seal between the substrate chamber and the vacuum chamber; and providing a hollow foreign material shield open at a top proximate to the vacuum chamber and a bottom proximate to the substrate chamber, the foreign material shield located between the ion beam axis and the flexible bellows, the top and bottom of the foreign material shield co-axially aligned with the ion beam axis.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 2A is detailed cross-sectional view of a bellows area of the ion beam tool of FIG. 1A;

FIG. 2B is a detailed cross-sectional view of an electron tool of the ion beam tool of FIG. 1A;

DETAILED DESCRIPTION

The term "ion beam system" is defined to be any tool that generates a beam of charged atoms or molecules and directs that charged species to the surface of or into the body of a substrate. Examples of ion beam systems include but is not limited to ion implantation tools and ion milling tools.

Figures 1A, 1B:
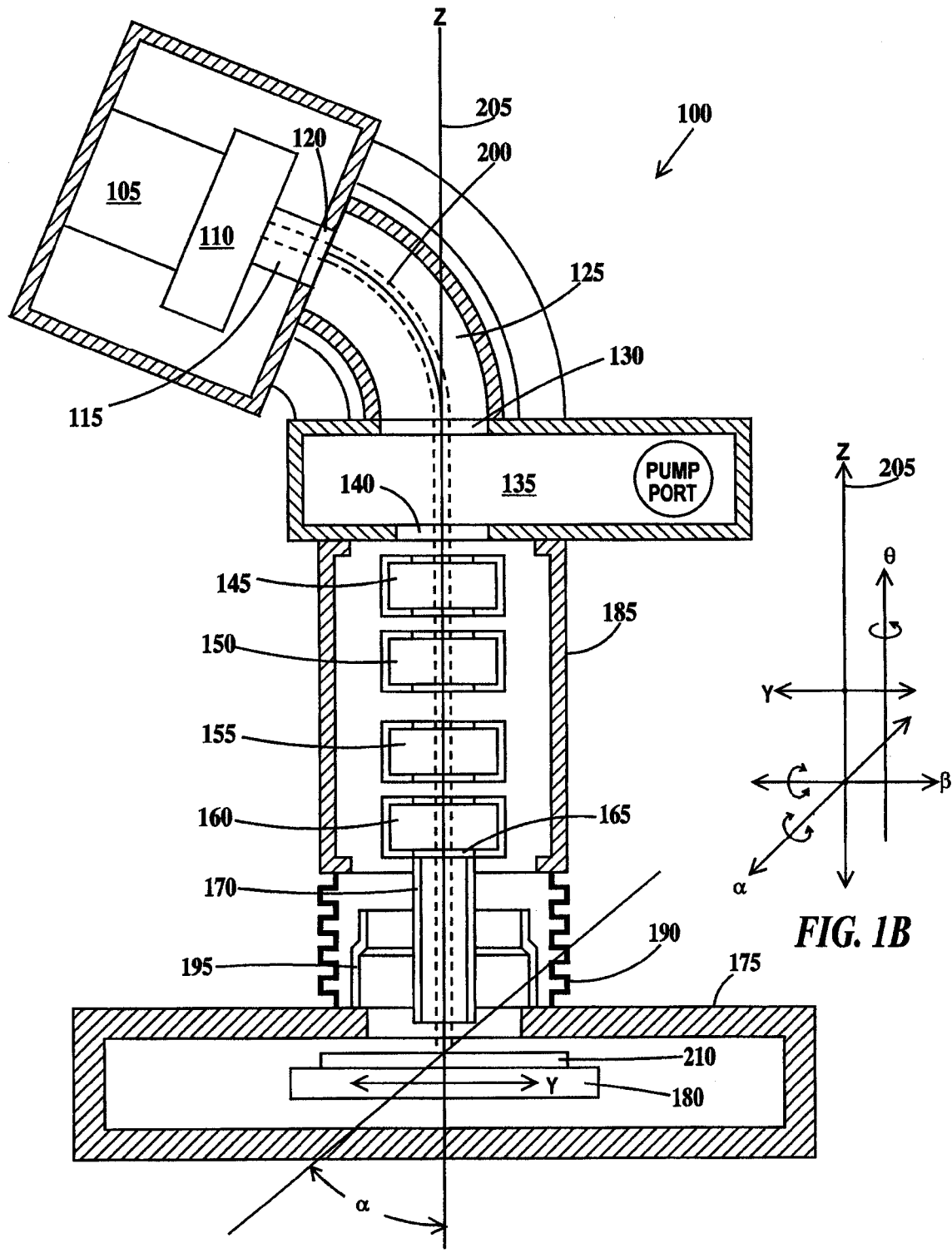
FIG. 1A a schematic side view of an ion beam system according to a first embodiment of the present invention.
FIG. 1B is a diagram illustrating the degrees of freedom of a substrate loaded into the ion beam system of FIG. 1A.

FIG. 1A a schematic side view of an ion beam system according to a first embodiment of the present invention. In FIG. 1A, an ion beam system 100 includes an ion source 105, an extractor 110 (which includes an extraction aperture), a first beam focuser 115 an exit aperture 120, a beam analyzer 125 (in one example, an electromagnet), a first defining aperture 130, a pumping chamber 135, a second defining aperture 140, a beam sampling section 145 (which includes a flag aperture), a second beam focuser 150, an electro-magnetic reflector (EMR) aperture 155, a secondary emission control assembly 160 (which includes an electron shower aperture 165), an electron shower tube 170, a substrate chamber 175, and an Yθ-stage 180. Second defining aperture 140, beam sampling section 145, second beam focuser 150, EMR aperture 155, and secondary emission control assembly 160 are housed within a vacuum chamber 185. Substrate chamber 175 is connected to vacuum chamber 185 by a bellows 190. A foreign material (FM) shield 195 is positioned between electron shower electron shower tube 170 and bellows 190. Electron shower tube 170 is negatively charged.

In operation, an ion plasma is generated within ion source 105 and ions extracted from the ion source by extractor 110 to generate an ion beam 200 (dashed lines). After being focused by first beam focuser 115, ion beam 200 is passed through beam analyzer 125 where only ions of a predetermined charge to mass ratio exit through first defining aperture 130. Ion beam 200 is now co-axially aligned with an ion beam axis 205 of ion beam system 100. After passing through pumping chamber 135, second defining aperture 140, beam sampling section 145 second beam focuser 150, EMR aperture 155, secondary emission control assembly 160, electron shower aperture 165 and electron shower tube 170, ion beam 200 strikes substrate 210 on YΘ stage 180.

In one example, ion beam 200 comprises charged species containing phosphorus, boron, arsenic, germanium, carbon, nitrogen, helium or combinations thereof.

Turning to FIG. 1B, FIG. 1B is a diagram illustrating the degrees of freedom of a substrate loaded into the ion beam system of FIG. 1A. Ion beam axis 205 defines a Z-direction. A Y-direction is defined as a direction orthogonal to the Z-direction and an X-direction is defined as a direction orthogonal to both the Z-direction and the Y-direction. The Y-direction defines a horizontal direction and the Z-direction defines a vertical direction. The Z-direction and the Y-directions are within the plane of the drawing, the X-direction goes into and extends out of the plane of the drawing. Substrate chamber 175 can tilt about both an α axis and a β axis. The degree of tilt for both the α axis and the β axis may be positive or negative, but is limited by the mechanical constraints of the system, particularly bellows 190, FM shield 195 and electron shower tube 170. The α axis is parallel to the X-direction, orthogonal to the both the Z-direction and the Y-direction and intersects ion beam axis 205. The β axis is parallel to the Y-direction, orthogonal to the both the Z-direction and the X-direction and intersects ion beam axis 205. YΘ stage 180 (see FIG. 1A) can move in the Y-direction and rotate in about a θ axis. The θ axis is parallel to the Z-direction and orthogonal to the both the Y-direction and the X-direction.

Returning to FIG. 1A, FM shield 195 is fixed to substrate chamber 175 and thus tilts when the substrate chamber is tilted and that electron shower tube 170 is fixed to vacuum chamber 185 and does not tilt when the substrate chamber is tilted. The entire path of ion beam 200 must be kept at high vacuum during operation of ion beam system 100. Thus the need for bellows 190 becomes apparent if the vacuum integrity of ion beam system is to be maintained as substrate chamber 175 is tilted. The fact that bellows 190 flexes causes generation of foreign material as described infra.

FIG. 2A is detailed cross-sectional view of the bellows area of ion beam tool 100 of FIG. 1A. In FIG. 2A, bellows 190 is seen to attach to substrate chamber 175 by a flange 215 and to vacuum chamber 185 by a flange 220. Bellows 190 is in physical, electrical and thermal contact with flanges 215 and 220 and flanges 215 and 220 are in physical, electrical and thermal contact with substrate chamber 175 and vacuum chamber 185 respectively. An outer surface 225 adjacent to a bottom surface 230 of FM shield 195 is in physical, electrical and thermal contact with flange 215. Thus when FM shield 195 comprises an electrically conducive material, the FM shield is in electrical contact with substrate chamber 175 and when FM shield 195 comprises an thermally conducive material, the FM shield is in thermal contact with substrate chamber 175. FM shield 195 may comprise a material that is both thermally and electrically conductive. Suitable materials for FM shield 195 include but is not limited to aluminum, stainless steel, ceramics (examples of which include boron nitride, aluminum oxide, aluminum silicate), silicon carbide, carbon, silicon and high temperature polymers. Other non-magnetic materials may be used as well, such as other metals. If magnetic materials are used, it must be ensured that the dimensions of FM shield 195 are such that the magnetic fields induced in the FM shield does not adversely effect ion beam diameter, ion beam cross-section distributions or the centrality of the ion beam relative to ion beam axis 205.

When FM shield 195 is a thermally conductive material, and if substrate chamber 175 is a thermal and electrical conductor (such as stainless steel or aluminum), the FM shield will act as a low temperature getter (it is heat sunk at room temperature, about 60° F. to about 70° F.) relative to the temperature of the internal vacuum (more correctly the temperature of the gas molecules remaining in the vacuum, about 1500° C. to about 3000° C.) as well as other components such as electron shower tube 170.

There are two dimensions to which FM shield 195 may conform. The first is a distance A between a top surface 235 of FM shield 195 and flange 220 and the second is a distance B from an inner surface 240 adjacent to top surface 235 of FM shield 195 and an outer surface 250 of electron shower tube 170. The distances A and B may be adjusted such that at maximum values of tilt angles α and β (see FIGS. 1A and 1B), top surface 235 of FM shield 195 does not come into contact with outer surface 250 of electron shower tube 170. As A decreases B may be allowed to decrease and vice versa within the limits that B can not be reduced to the point where the efficiency of pumping to maintain the vacuum in substrate chamber 175 is effected. C is the distance between flanges 215 and 220 and D0 is the diameter of electron shower tube 170.

Turning to FIG. 2B, FIG. 2B is a detailed cross-sectional view of electron shower tube 170. Electron shower tube 170 has a grooved inner surface 255 and is made of an electrically conductive material (for example, graphite). The purpose of electron shower tube 170 is to maintain a space charge region 260 around ion beam 200 as the ion beam transitions from vacuum chamber 185 into substrate chamber 175. Each grove 265 in grooved surface 255 includes a sloped top surface 270 and a horizontal bottom surface 275. The purpose of grooves 265 is to allow foreign material 280 to collect on sloped top surfaces 270 while leaving horizontal bottom surface 275 exposed to maintain space charge region 260. As foreign material 280 accumulates on inner sidewall 255 of electron shower tube 170, the effectiveness of space charge region 260 (see FIG. 2A) diminishes.

Returning to FIG. 2A, there are two sources of foreign material that may impinge on wafer 210, that FM shield 195 reduces or eliminates. The first source is vapors and particles generated from ion beam 200 striking substrate 210. If substrate 210 is a semiconductor wafer than the vapor and particles given off may include photoresist and other organic materials, metals, silicon and ion implanted species. These materials, in vapor form coat an inner surface 285 of bellows 190, outer surface 250 and inner surface 255 of electron shower tube 170. These coatings can then flake off inner surface 285 of bellows 190, outer surface 250 and inner surface 255 of electron shower tube 170 and impinge on substrate 210. Since FM shield 195 is colder than electron shower tube 170, these vapors are attracted to the FM shield and much of the vapors that would end up coating electron shower tube 170 and bellows 190 are gettered by and end up coating the FM shield, particularly inside surface 240 of the FM shield. The physical placement of FM shield 195 further substantially blocks particles shedding from or flaking off the coating on inside surface 285 of bellows 190 as the bellows flexes as substrate chamber 175 is tilted (see FIGS. 1A and 1B).

The second source of foreign material is material from internal portions of the tool through which the ion beam passes (such as apertures) in the form of vapor or particles that is transported by the beam. Much of this material is trapped between outer surface 255 of FM shield 230 and inner wall 285 of bellows 190. The smaller the dimensions A and/or B, the more of this second source material is prevented from impinging on substrate 210.

Figure 3A:
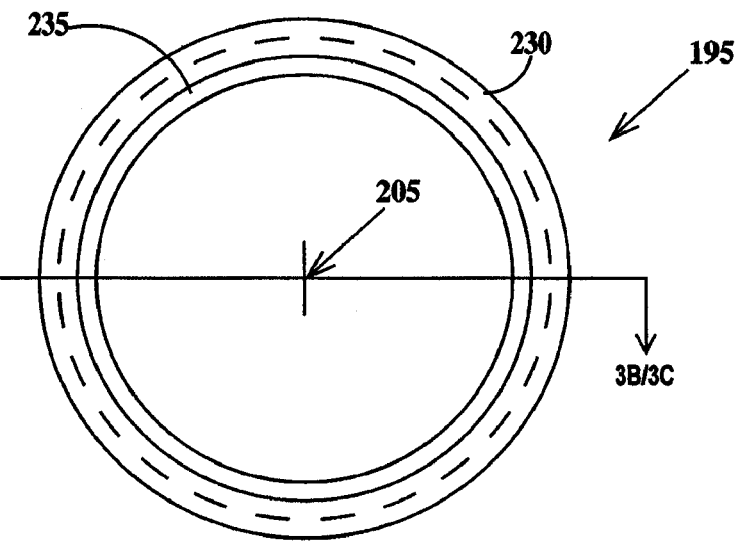
FIG. 3A is a top view and FIGS. 3B and 3C are side view through line 3B/3C—3B/3C of FIG. 3A of a first foreign material shield according to the present invention.
Figure 3B:
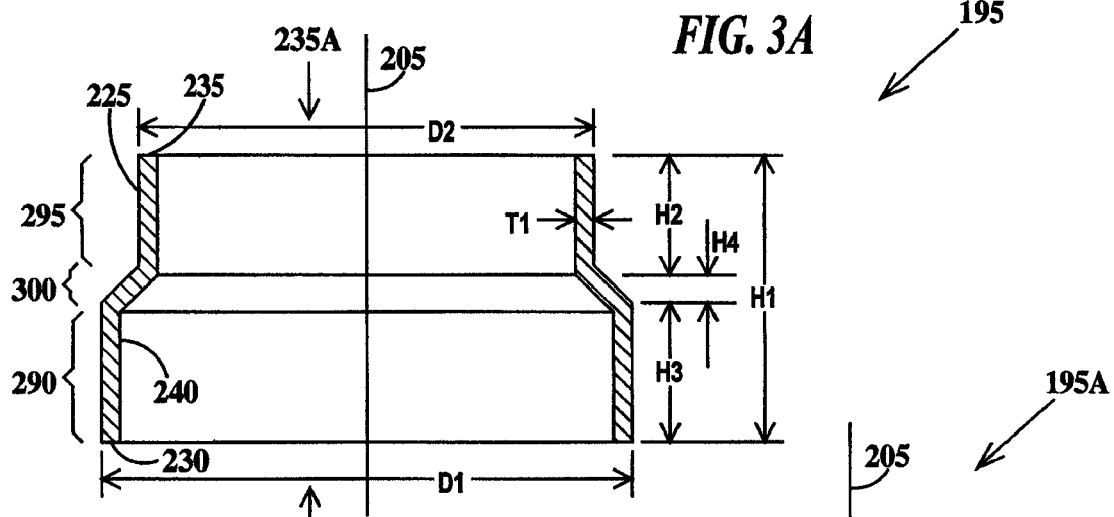
Figure 3C:
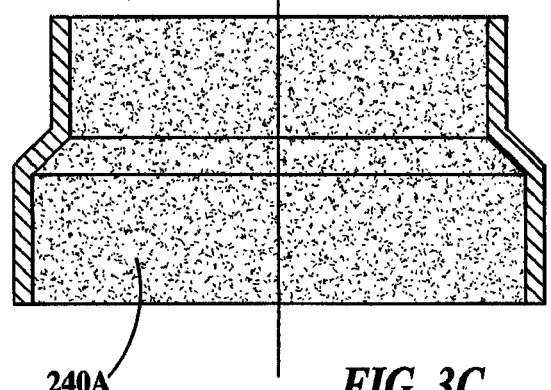

FIG. 3A is a top view and FIGS. 3B and 3C are side view through line 3B/3C—3B/3C of FIG. 3A of a first FM shield according to the present invention. In FIGS. 3A and 3B, it may be seen that FM shield 195 comprises a hollow cylindrical bottom portion, 290 joined to a narrower top hollow cylindrical top portion 295 by a hollow tapered transition portion 300. Bottom portion 290, top portion 295 and transition portion 300 are integrally formed as a single unit. FM shield 195 has a top circular opening 235A defined by top surface 235 and a bottom circular opening 230A defined by bottom surface 230. The overall height of FM shield 195 is H1, the height of top portion 295 is H2, the height of transition region 300 is H4. The outside diameter of bottom portion 290 is D1 and of top portion 295 is D2. The wall thickness of FM shield 195 is T1. When used in an ion beam system for ion implanting 200 mm wafer substrates H1 ranges from about 2 inches to about 4.25 inches, H2 ranges from about 0.4 inches to about 1.5 inches, H3 is about 0.8 inches, H4 ranges from about 0.7 to about 1.9 inches, D1 is about 6.4 inches and D2 ranges from about 5.8 inches to about 6.0 inches (however D1 is always greater than D2) and T1 is about one eight of an inch. When FM shield 195 is installed in ion beam system 100 (see FIG. 1A) the center of diameters D1 and D2 are intersected by ion beam axis 205.

While in FIG. 3B, inside surface 240 of FM shield is smooth, in FIG. 3C, it is seen that inside surface 240A of FM shield 195A is textured. The term textured is defined to include roughing, lining and stippling. Otherwise FM shields 195 and 195A are identical. Texturing is optional, however, texturing lowers the possibility of layers of foreign material that deposit on surface 240A will shed, peel or flake off. Texturing may be accomplished, for example, by sand blasting, bead blasting or vapor blasting. Texture may be accomplished by grinding, scratching or machining surface 240A. All variations of FM shields discussed infra and illustrated in FIGS. 4B, 5B, 6B, 7B 8B and 9B may have textured inside surfaces.

Figure 4A:
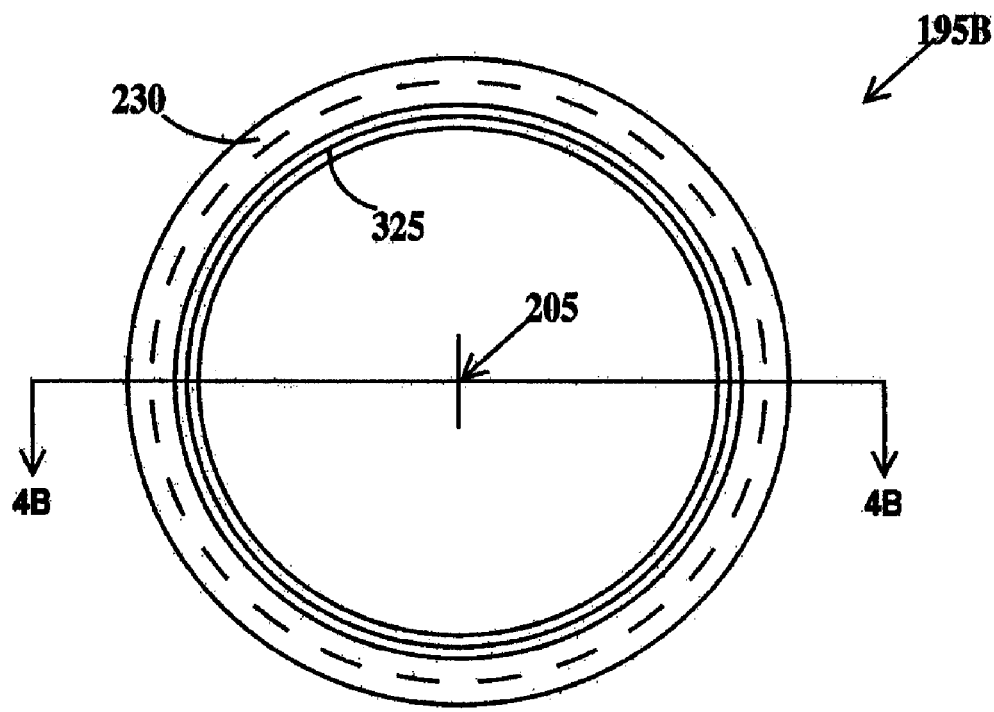
FIG. 4A is a top view and FIG. 4B is a side view through line 4B—4B of FIG. 4A of a second FM shield according to the present invention.
Figure 4B:
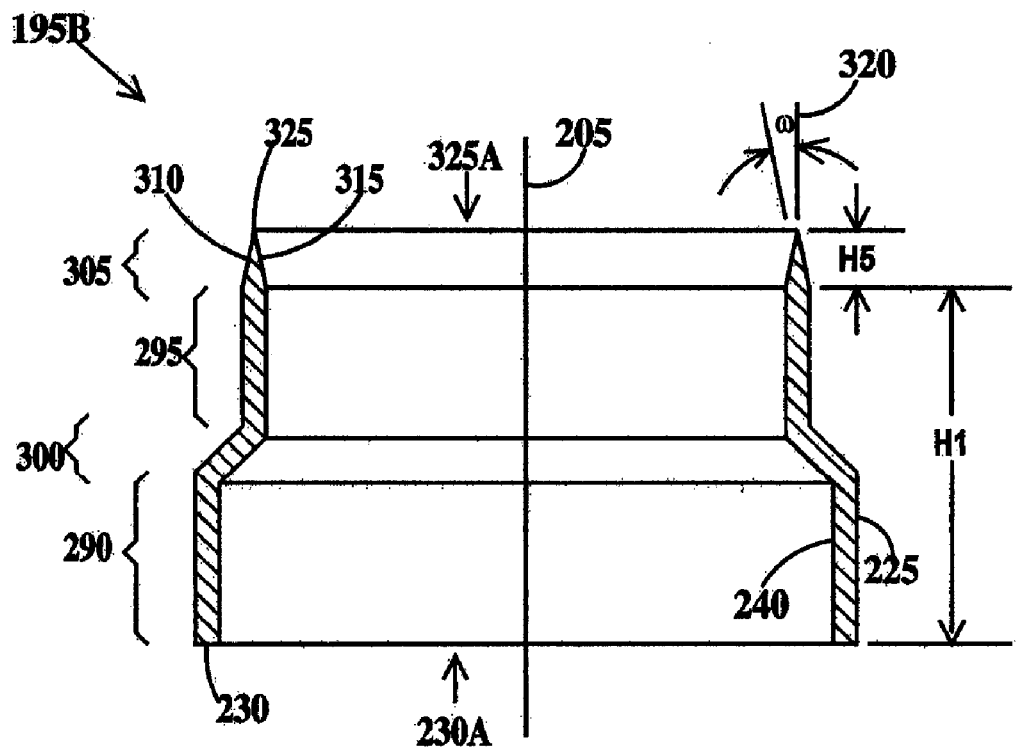

FIG. 4A is a top view and FIG. 4B is a side view through line 4B—4B of FIG. 4A of a second FM shield according to the present invention. In FIGS. 4A and 4B, an FM shield 195B is similar to FM shield 195 of FIGS. 3A and 3B except an integral dual tapered ring portion 305 is integrally formed to top portion 295. Ring portion 305 has an outer sloped surface 310 and an inner sloped surface 315 (both of equal length and both slanting at an angle w from an axis 320 aligned parallel with ion beam axis 205) and meeting in a edge 325. FM shield 195B has a top circular opening 325A defined by edge 325 and bottom circular opening 230A defined by bottom surface 230. Ring portion 305 has a height H5. Continuing the example of FIGS. 3A and 3B, H5 is about 1.25 inches and ω is about 10°. The 10° taper on outer and inner surfaces 310 and 315 allows in increase in overall effective height from H1 to H1 plus H5 without effecting the maximum values of α and β (see FIG. 1B).

Figure 5A:
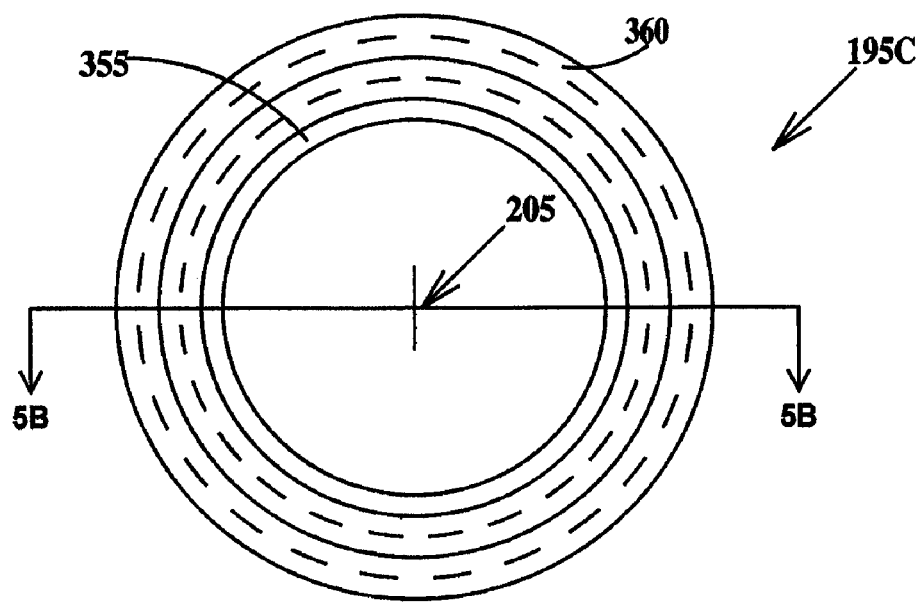
FIG. 5A is a top view and FIG. 5B is a side view through line 5B—5B of FIG. 5A of a third FM shield according to the present invention.
Figure 5B:
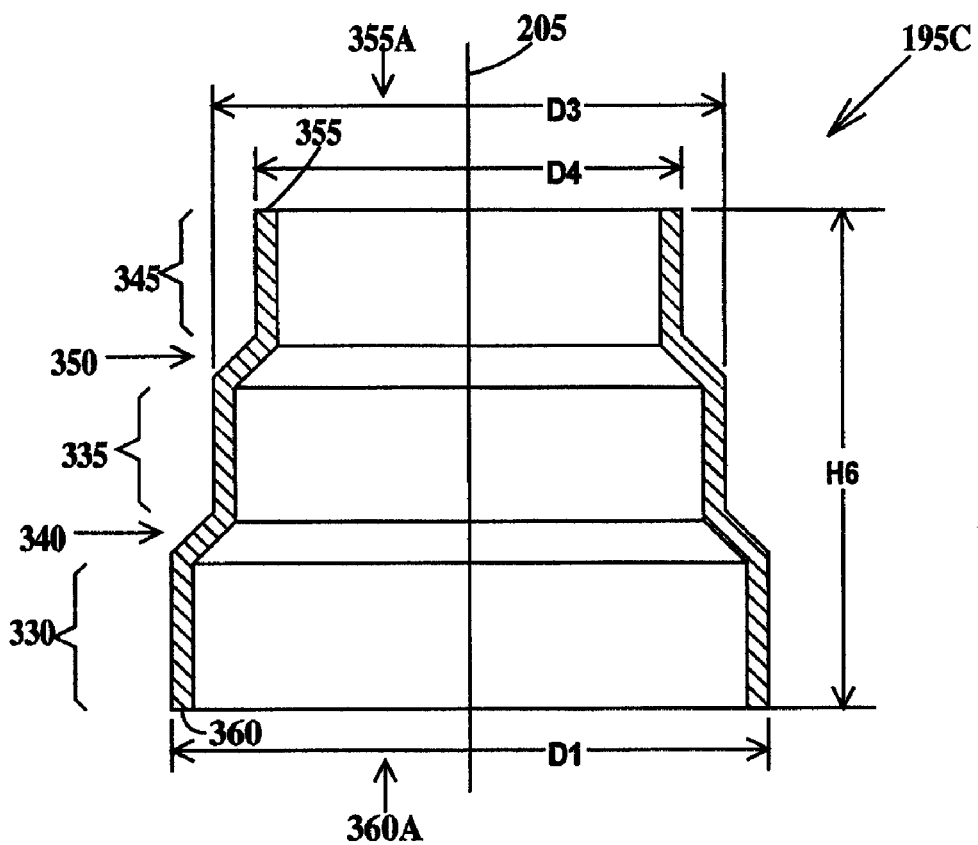

FIG. 5A is a top view and FIG. 5B is a side view through line 5B—5B of FIG. 5A of a third FM shield according to the present invention. In FIGS. 5A and 5B, an FM shield 195C is similar to FM shield 195 of FIGS. 3A, 3B and 3C except there is an additional hollow cylindrical portion and an additional hollow tapered transition portion. In FIGS. 5A and 5B, a bottom hollow cylindrical portion 330 having an outside diameter D1 is joined to a middle hollow cylindrical portion 335 having an outside diameter D3 by a first hollow tapered transition portion 340. Middle hollow cylindrical portion 335 is joined to a top hollow cylindrical portion 345 having an outside diameter D4 by a second hollow tapered transition portion 350. Top hollow cylindrical portion 345 has a flat top edge 355. Portions 330, 335, 340, 345 and 350 of FM shield 195C are integrally formed. FM shield 195C has a top circular opening 355A defined by top surface 355 and a bottom circular opening 360A defined by a bottom surface 360. FM shield 195C has an overall height H6. D1 is greater than D3 and D3 is greater than D4. When FM shield 195C is installed in ion beam system 100 (see FIG. 1A) the center of diameters D1, D4 and D4 are intersected by ion beam axis 205.

FM shields of the type illustrated in FIGS. 5A and 5B and described supra, may include any number of hollow cylinder portions and hollow tapered transition portions.

Figure 6A:
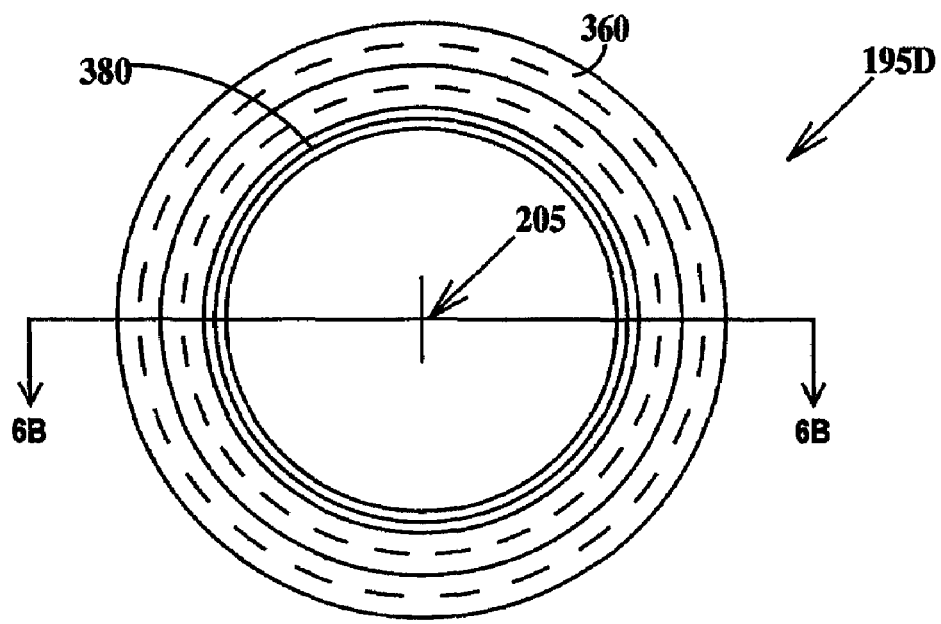
FIG. 6A is a top view and FIG. 6B is a side view through line 6B—6B of FIG. 6A of a fourth FM shield according to the present invention.
Figure 6B:
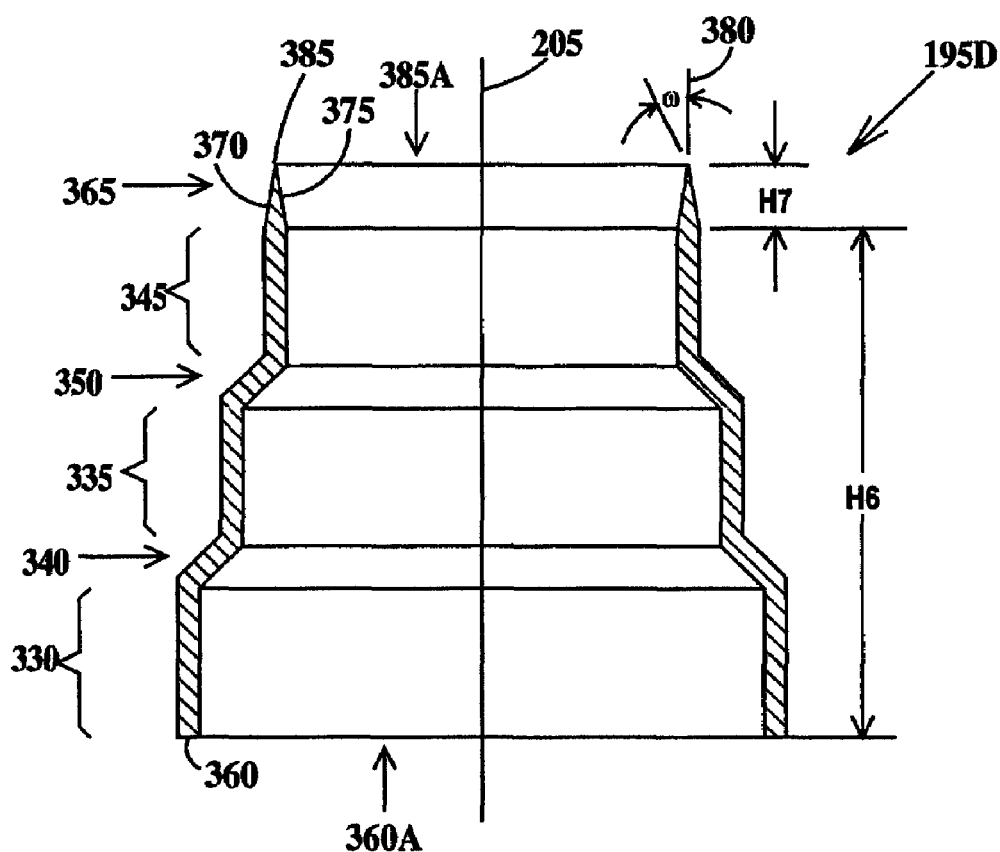

FIG. 6A is a top view and FIG. 6B is a side view through line 6B—6B of FIG. 6A of a fourth FM shield according to the present invention. In FIGS. 6A and 6B, an FM shield 195D is similar to FM shield 19C of FIGS. 5A and 5B except an integral dual tapered ring portion 365 is integrally formed to top portion 345. Ring portion 365 has an outer sloped surface 370 and an inner sloped surface 375 (both of equal length and both slanting at an angle w from an axis 380 aligned with ion beam axis 205) and meeting in a edge 385. FM shield 195D has a top circular opening 385A defined by edge 385 and a bottom circular opening 360A defined by bottom surface 360. Ring portion 360 has a height H7. ω is about 10°. The 10° taper on outer and inner surfaces 370 and 375 allows in increase in overall effective height from H6 to H6 plus H7 without effecting the maximum values of α and β (see FIG. 1B).

Figure 7A:
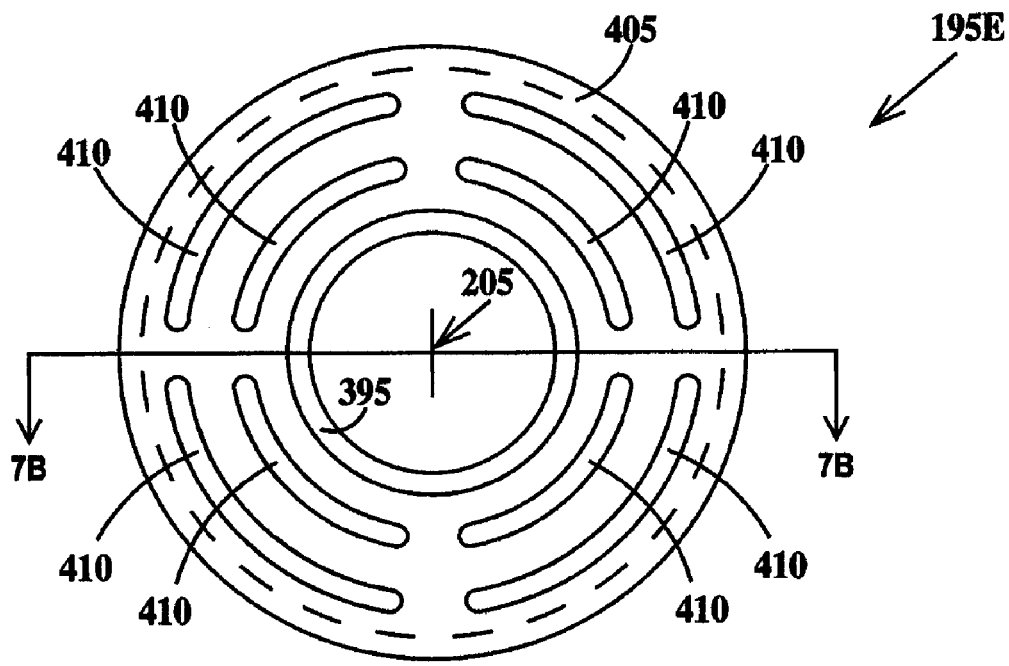
FIG. 7A is a top view and FIG. 7B is a side view through line 7B—7B of FIG. 7A of a fifth FM shield according to the present invention.
Figure 7B:
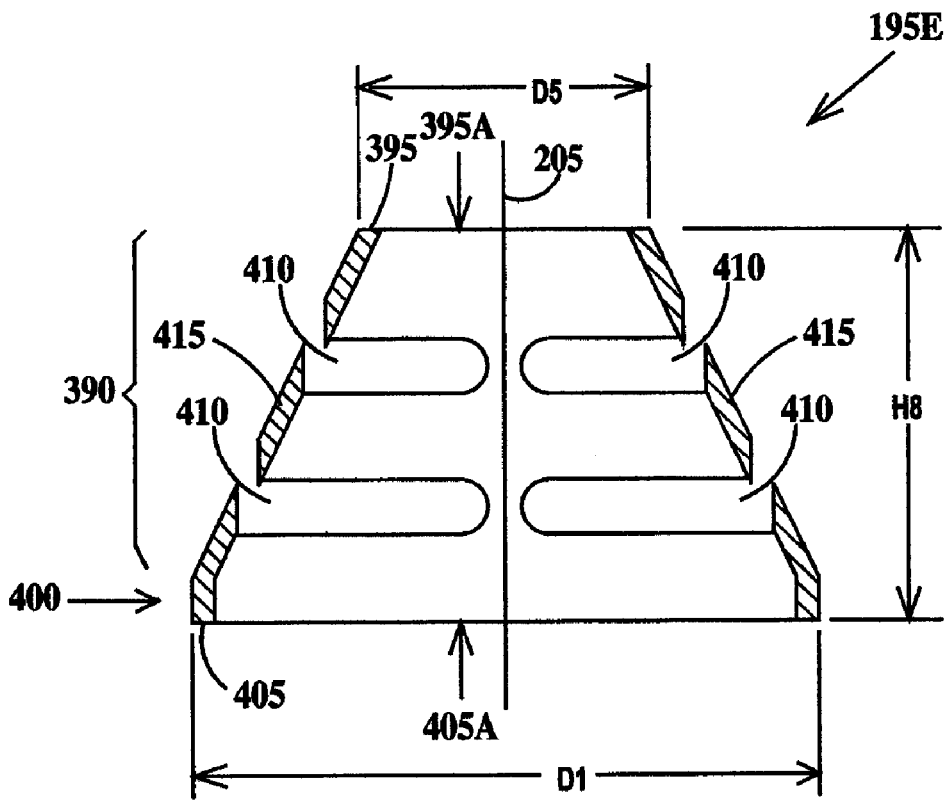

FIG. 7A is a top view and FIG. 7B is a side view through line 7B—7B of FIG. 7A of a fifth FM shield according to the present invention. In FIGS. 7A and 7B, FM shield 195E comprises a hollow truncated conical portion 390 having a top surface 395 and a bottom integral ring portion 400 having a bottom surface 405. Multiple rows (two are illustrated) of optional slots 410 are formed in wall 410 of conical portion 405. FM shield 195E has a top circular opening 395A defined by top surface 395 and a bottom circular opening 405A defined by bottom surface 405. FM shield has a bottom outside diameter of D1, a top outside diameter of D5 and a height of H8. When FM shield 195E is installed in ion beam system 100 (see FIG. 1A) the center of diameters D1 and D5 are intersected by ion beam axis 205.

Figure 8A:
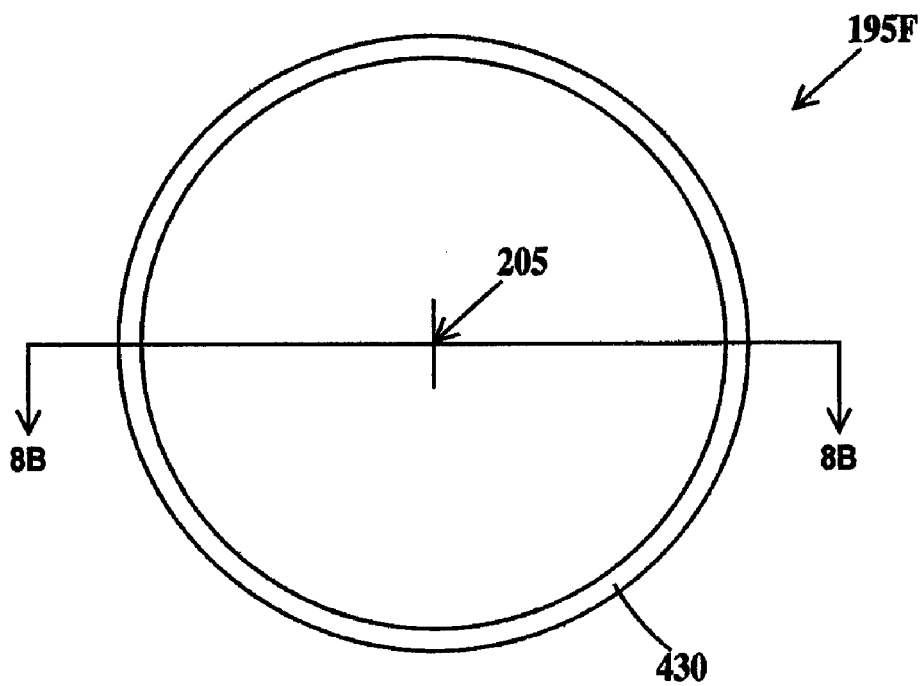
FIG. 8A is a top view and FIG. 8B is a side view through line 8B—8B of FIG. 8A of a sixth FM shield according to the present invention.
Figure 8B:
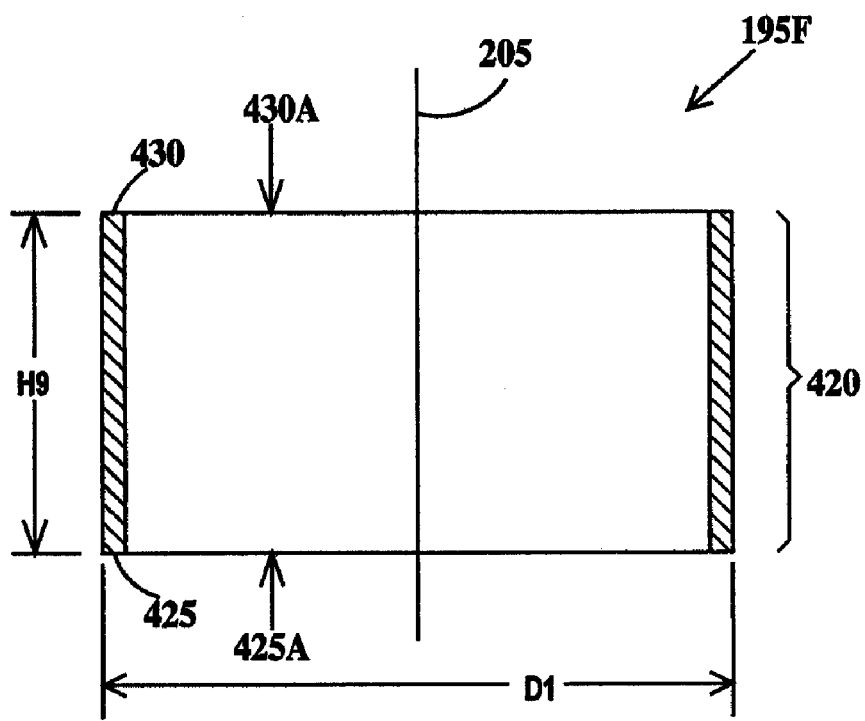

FIG. 8A is a top view and FIG. 8B is a side view through line 8B—8B of FIG. 8A of a sixth FM shield according to the present invention. In FIGS. 8A and 8B, FM shield 195F comprises a hollow cylinder 420 having a bottom surface 425 and a top surface 430. FM shield 195F has a top circular opening 430A defined by top surface 430 and a bottom circular opening 425A defined by bottom surface 425. FM shield has diameter of D1 and a height of H9. When FM shield 195F is installed in ion beam system 100 (see FIG. 1A) the center of diameter D1 is intersected by ion beam axis 205.

Figure 9A:
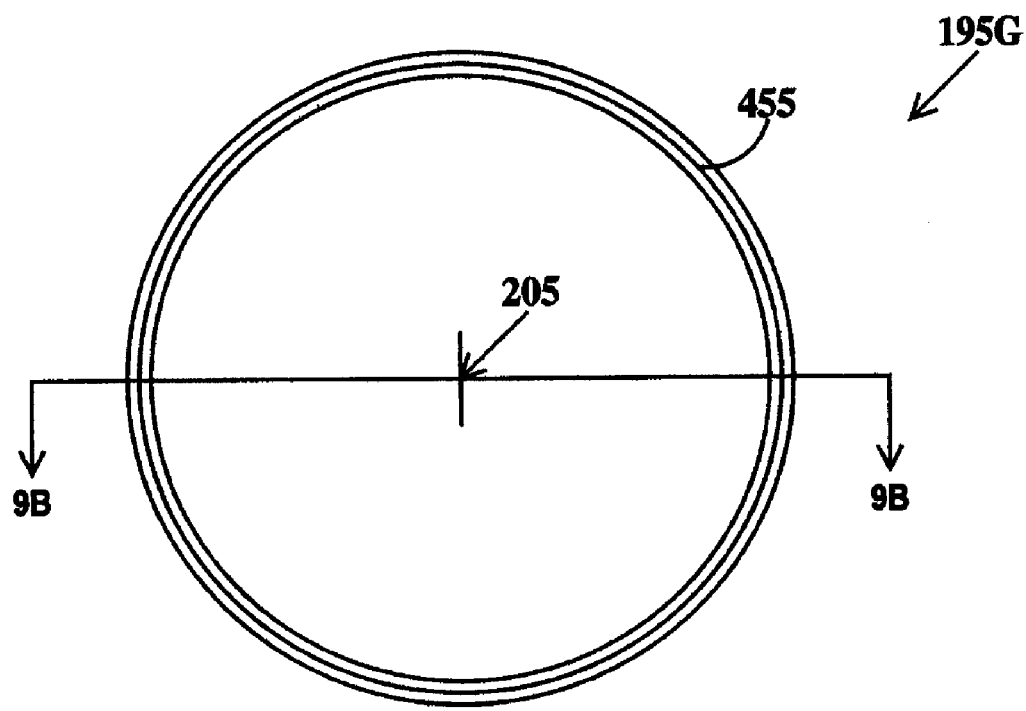
FIG. 9A is a top view and FIG. 9B is a side view through line 9B—9B of FIG. 9A of a seventh FM shield according to the present invention.
Figure 9B:
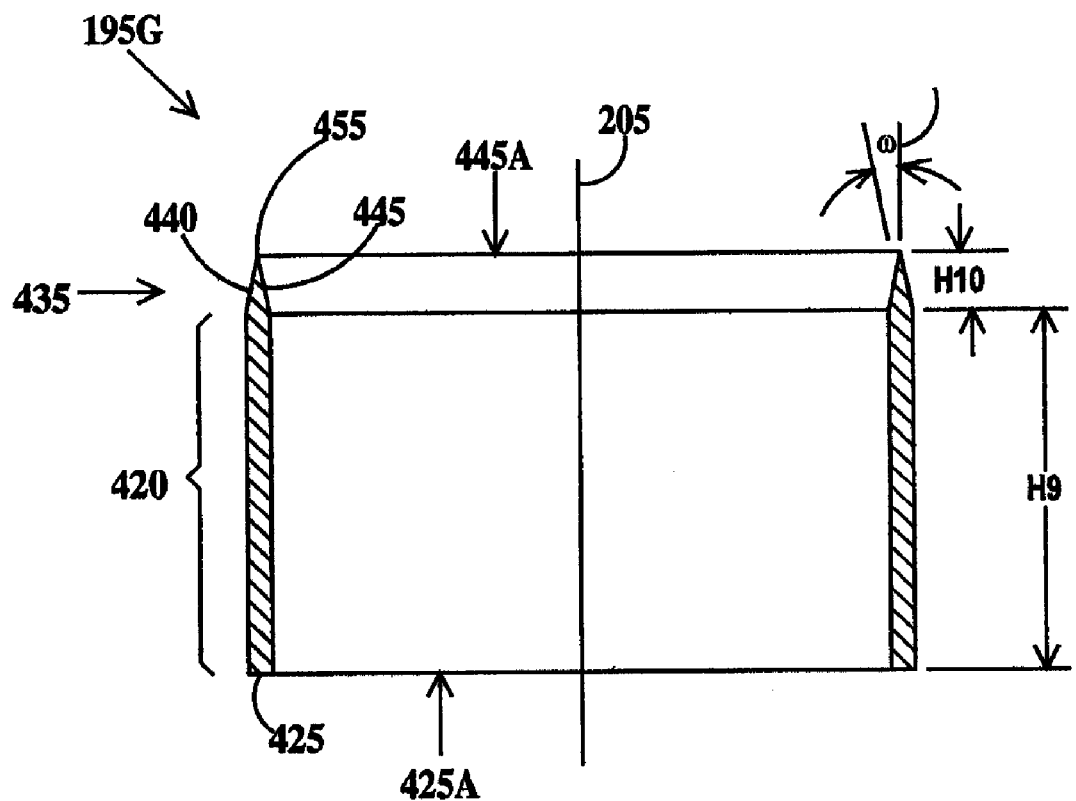

FIG. 9A is a top view and FIG. 9B is a side view through line 9B—9B of FIG. 9A of a seventh FM shield according to the present invention. In FIGS. 9A and 9B, an FM shield 195G is similar to FM shield 195F of FIGS. 8A and 8B except an integral dual tapered ring portion 435 is integrally formed with cylinder 420. Ring portion 435 has an outer sloped surface 440 and an inner sloped surface 445 (both of equal length and both slanting at an angle ω from an axis 450 aligned with ion beam axis 205) and meeting in a edge 455. FM shield 195G has a top circular opening 445A defined by edge 455 and bottom circular opening 425A defined by bottom surface 425. Ring portion 435 has a height H10. ω is about 10°. The 10° taper on outer and inner surfaces 440 and 445 allows in increase in overall effective height from H9 to H9 plus H10 without effecting the maximum values of α and β (see FIG. 1B).

Figure 10:
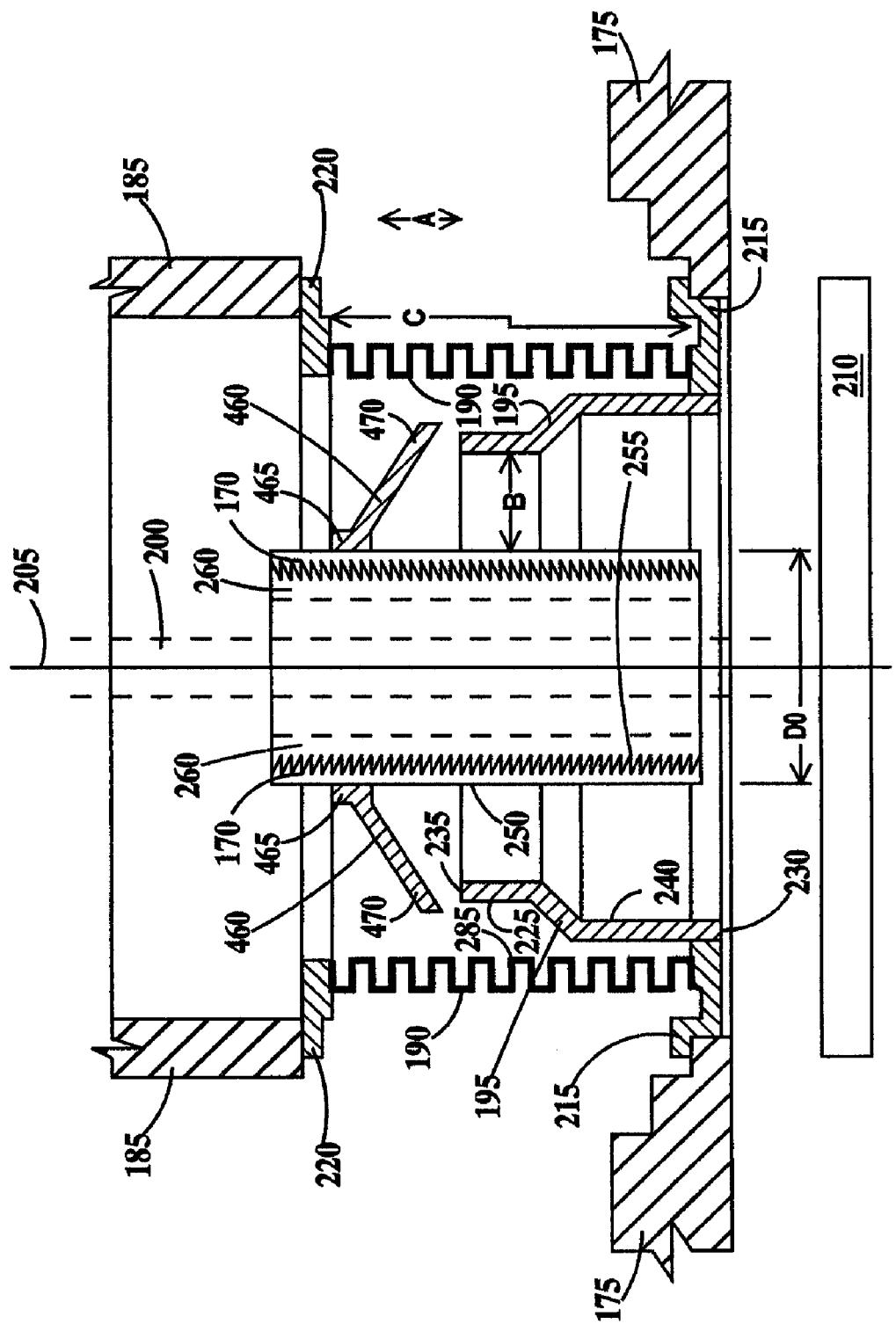
FIG. 10 is detailed cross-sectional view of a bellows area of an ion beam tool according to a second embodiment of the present invention.

FIG. 10 is detailed cross-sectional view of a bellows area of an ion beam tool according to a second embodiment of the present invention. FIG. 10 is similar to FIG. 2, except an upper FM shield 460 has been added. Upper FM shield 460 includes a collar 460 attached to outer surface 250 of electron shower tube 170 and positioned between vacuum chamber 185 and FM shield 195 and a flange 470. Flange 470 extends outward and downward from vacuum chamber 185 toward FM shield 195. Optionally flange 470 may extend outwardly only. Flange 470 extends past top surface 235 of FM shield 470. A space is left between upper FM shield 460 and FM shield 195 sufficient large enough so as to not effect the pumping efficiency of the tool. Suitable materials for upper FM shield 460 include but is not limited to aluminum, stainless steel, ceramics (examples of which include boron nitride, aluminum oxide, aluminum silicate), silicon carbide, carbon, silicon and high temperature polymers. Upper FM shield may be used with any of FM shields 195A, 195B, 195C, 195D, 195E, 1955F and 195G described supra.

Thus, the present invention reduces foreign material contamination of substrates in ion beam systems.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. An ion beam system, comprising:
a vacuum chamber having an opening, said opening co-axially aligned with an ion beam axis;
a substrate chamber having an opening, said opening co-axially aligned with said ion beam axis, said substrate chamber free to tilt about a tilt axis, said tilt axis orthogonal to and intersecting said ion beam axis;
a flexible bellows connecting said opening in said substrate chamber with said opening in said vacuum chamber, said bellows co-axially aligned with said ion beam axis, said bellows providing a vacuum seal between said substrate chamber and said vacuum chamber; and
a hollow foreign material shield open at a top proximate to said vacuum chamber, said top of said foreign material shield not extending past said opening in said vacuum chamber into said vacuum chamber and not attached to any structure within said vacuum chamber, said foreign material shield open at a bottom, said bottom of said foreign material shield fixidly attached and electrically connected to said substrate chamber, said foreign material shield located between said ion beam axis and said flexible bellows, said top and bottom of said foreign material shield co-axially aligned with said ion beam axis.

2. The system of claim 1, further including:
an electron shower tube, open at a top and a bottom and located between said ion beam axis and foreign material shield, said top and bottom of said electron shower tube co-axially aligned with said ion beam axis.

3. The system of claim 1, further including:
an ion beam analyzer located between an ion beam source and said vacuum chamber.

4. The system of claim 3, further including:
a vacuum pump port located between said ion beam analyzer and said vacuum chamber.

5. The system of claim 1, further including:
a substrate stage located in said substrate chamber, said substrate stage rotatable about an axis both parallel to said ion beam axis and said substrate stage free to reciprocate within said substrate chamber along a longitudinal axis of said substrate chamber.

6. The system of claim 1, wherein said substrate chamber is free to tilt about a additional tilt axis, said additional tilt axis orthogonal to and intersecting both said tilt axis and said ion beam axis.

7. The system of claim 1, wherein a portion of said foreign material shield adjacent to said bottom of said foreign material shield is in thermal contact with said substrate chamber.

8. The system of claim 1, wherein said foreign material shield is a cylinder.

9. The system of claim 8, wherein inner and outer surfaces adjacent to said top of said foreign material shield taper to the same edge.

10. The system of claim 1, wherein said foreign material shield comprises integral cylinders of decreasing diameter from a bottom most cylinder including said bottom of said foreign material shield to a topmost cylinder including said top of said foreign material shield.

11. The system of claim 10, wherein inner and outer surfaces adjacent to said topmost cylinder of said foreign material shield taper to the same edge.

12. The system of claim 10, wherein said cylinders of decreasing diameter are joined by integral transition rings having sloped outside surfaces.

13. The system of claim 1, wherein said foreign material shield comprises a truncated cone, said top of said foreign material shield having a lesser diameter than said bottom of said foreign material shield.

14. The system of claim 13, wherein a sidewall of said foreign material shield is slotted.

15. The system of claim 1, where said ion beam source generates charged species selected from the group consisting of phosphorus, boron, arsenic, germanium, carbon, nitrogen, helium or combinations.

16. The system of claim 1, wherein an inside surface of said foreign material shield is textured.

17. The system of claim 1, wherein said foreign material shield includes a material selected from the group consisting of aluminum, stainless steel, ceramics, silicon carbide, carbon, silicon and high temperature polymers.

18. The system of claim 1, further including:
an additional hollow foreign material shield open at a top proximate to said vacuum chamber and at a bottom proximate to said foreign material shield, said additional foreign material shield located between said ion beam axis and said flexible bellows, said top and bottom of said additional foreign material shield co-axially aligned with said ion beam axis and a flange portion of said additional foreign material shield extending over said top of said foreign material shield.

19. A method of reducing foreign material contamination of a substrate in an ion beam system, comprising:
providing a vacuum chamber having an opening, said opening co-axially aligned with an ion beam axis;

providing a substrate chamber having an opening, said opening co-axially aligned with said ion beam axis, said substrate chamber free to tilt about a tilt axis, said tilt axis orthogonal to and intersecting said ion beam axis;

providing a flexible bellows connecting said opening in said substrate chamber with said opening in said vacuum chamber, said bellows co-axially aligned with said ion beam axis, said bellows providing a vacuum seal between said substrate chamber and said vacuum chamber; and providing a hollow foreign material shield open at a top proximate to said vacuum chamber, said top of said foreign material shield not extending past said opening in said vacuum chamber into said vacuum chamber and not attached to any structure within said vacuum chamber, said foreign material shield open at a bottom, said bottom of said foreign material shield fixidly attached and electrically connected to said substrate chamber, said foreign material shield located between said ion beam axis and said flexible bellows, said top and bottom of said foreign material shield co-axially aligned with said ion beam axis.

20. The method of claim 19, further including:
providing an electron shower tube, open at a top and a bottom and located between said ion beam axis and foreign material shield, said top and bottom of said electron shower tube co-axially aligned with said ion beam axis.

21. The method of claim 19, further including:
providing an ion beam analyzer located between an ion beam source and said vacuum chamber; and
providing a vacuum pump port located between said ion beam analyzer and said vacuum chamber.

22. The method of claim 19, further including:
providing a substrate stage located in said substrate chamber, said substrate stage rotatable about an axis parallel to said ion beam axis and said substrate stage free to reciprocate within said substrate chamber and along a longitudinal axis of said substrate chamber.

23. The method of claim 19, wherein said substrate chamber is free to tilt about a additional tilt axis, said additional tilt axis orthogonal to and intersecting both said tilt axis and said ion beam axis.

24. The method of claim 19, wherein a portion of said foreign material shield adjacent to said bottom of said foreign material shield is in thermal contact with said substrate chamber.

25. The method of claim 19, wherein said foreign material shield comprises a cylinder, integral cylinders of decreasing diameter from a bottom most cylinder including said bottom of said foreign material shield to a topmost cylinder including said top of said foreign material shield, or a truncated cone, said top of said foreign material shield having a lesser diameter than said bottom of said foreign material shield.

26. The method of claim 19, wherein an inside surface of said foreign material shield is textured.

27. The method of claim 19, wherein a portion of said foreign material shield adjacent to said bottom of said foreign material shield is in thermal contact with said substrate chamber.

28. The method of claim 19, further including:
providing an additional hollow foreign material shield open at a top proximate to said vacuum chamber and at a bottom proximate to said foreign material shield, said additional foreign material shield located between said ion beam axis and said flexible bellows, said top and bottom of said additional foreign material shield co-axially aligned with said ion beam axis and a flange portion of said additional foreign material shield extending over said top of said foreign material shield.

29. The method of claim 19, further including, mechanically trapping, between an inside surface of said bellows and an outside surface of said foreign material shield, foreign material shedding from an inside surface of said flexible bellows between said flexible bellows and said foreign material shield.

30. The method of claim 19, further including gettering gaseous species on at least an inside surface of said foreign material shield.

* * * * *

UNITED STATES PATENT AND TRADEMARK OFFICE
CERTIFICATE OF CORRECTION

| | | |
|---|---|---|
| PATENT NO. | : 7,078,710 B2 | Page 1 of 1 |
| APPLICATION NO. | : 10/710051 | |
| DATED | : July 18, 2006 | |
| INVENTOR(S) | : Desai et al. | |

It is certified that error appears in the above-identified patent and that said Letters Patent is hereby corrected as shown below:

Column 8
Line 9, delete "both"

Signed and Sealed this

Nineteenth Day of June, 2007

JON W. DUDAS
*Director of the United States Patent and Trademark Office*